INVENTOR
B. SENITZKY
BY Arthur J. Torsiglieri
ATTORNEY

INVENTOR
B. SENITZKY
BY
Arthur J. Torsiglieri
ATTORNEY

United States Patent Office 2,994,811

Patented Aug. 1, 1961

2,994,811

ELECTROSTATIC FIELD-EFFECT TRANSISTOR HAVING INSULATED ELECTRODE CONTROLLING FIELD IN DEPLETION REGION OF REVERSE-BIASED JUNCTION

Benjamin Senitzky, Berkeley Heights, N.J., assignor to Bell Telephone Laboratories, Incorporated, New York, N.Y., a corporation of New York Filed May 4, 1959, Ser. No. 810,727
3 Claims. (Cl. 317—235)

This invention relates to semiconductive devices.

An object of the present invention is a semiconductive device, useful as a switch or amplifier, which exhibits a very high input impedance. Such a device permits operation with very small amounts of input or control power.

To this end, the invention relates to a semiconductive device in which the input or control voltage is applied between an electrode which is connected to the semiconductive wafer of the device and a control electrode, which is insulated from the semiconductive wafer, to affect the electric field in the interior of the wafer. This control technique makes possible a switch or amplifier whose input impedance can be many megohms.

In accordance with the invention, there is provided a semiconductive device comprising a semiconductive wafer which includes therein a rectifying junction dividing the wafer into two zones of different conductivity type and a separate electrode connected to each of the two zones. The wafer is appropriately designed so that when a reverse bias is applied to the two electrodes the electric field in the wafer will be at a maximum at a discrete portion of the rectifying junction which is close to but does not intersect the surface of the wafer. At this region of the surface of the wafer, there is positioned a control electrode electrically insulated from the wafer. A signal applied to this control electrode is used to vary the electric field in the wafer selectively where the electric field in the wafer is at a maximum. In this manner, there can be varied, without drawing any control current, the breakdown characteristics of the junction and so the resistance seen between the two electrodes connected to the wafer.

A feature of the invention is a wafer which includes a rectifying junction which has a limited interior portion along which the impurity gradient is steeper than along the remaining portion of the junction. As a result, upon the application of a reverse bias across the rectifying junction the electric field will be at a maximum along the limited interior portion of the junction.

Another feature of the invention is a wafer which includes a rectifying junction which is positioned close to a control electrode adjacent to but electrically insulated from one face of the wafer. As a consequence, upon the application of a voltage difference between the control electrode and the wafer a limited interior portion of the rectifying junction is influenced more than the remaining portion of the rectifying junction.

In a preferred embodiment these two features are related such that the same limited interior portion of the rectifying junction is the region both where the maximum electric field is generated upon the application of a reverse bias across the rectifying junction and where the voltage applied to the control electrode exerts its maximum influence. These two features combine to insure that operation is dependent primarily on bulk, rather than surface properties of the wafer, and consequently a higher degree of reliability is achieved. This stems from the fact that it is considerably easier to control and stabilize the bulk properties of a semiconductive wafer than its surface properties.

Another feature of the invention is a wafer with a rectifying junction such that breakdown is limited to a single localized area estimated to be about one micron in diameter per milliampere of current. By localizing the breakdown in this way, there is avoided the noise which is characteristic of a large area breakdown.

The invention will be better understood from the following more detailed description, taken in conjunction with the accompanying drawing, in which.

Figure 1:
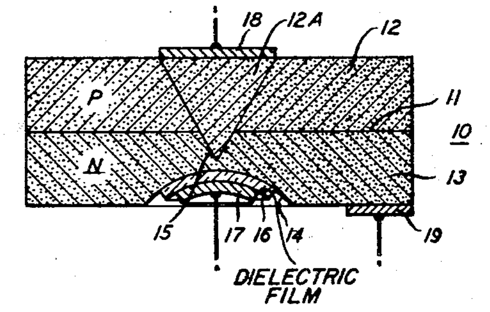
FIG. 1 shows in cross section a semiconductive device in accordance with the invention.

With reference now to the drawing, the device of FIG. 1 includes a silicon wafer 10 which includes a rectifying junction 11 dividing the element into p-type zone 12 and n-type zone 13. The surface of the n-type zone includes a depressed or dimpled region 14 which extends into the element and approaches close to the rectifying junction. The junction 11 which is planar over most of its area includes a pointed portion opposite the depression 14 which departs from planarity to approach close to the surface of the wafer. This this end, the p-type zone advantageously includes an alloy region 12A which extends from the surface in the form of a pyramid with its base on the surface and its apex extending into the n-type zone as shown. Advantageously, such portion has its apex 15 opposite the deepest penetration of the depression. Moreover, the resistivity of the n-type material advantageously is lower at the apex than along the remainder of the rectifying junction. To this end, the resistivity of the n-type layer advantageously is graded, increasing with distance in from the plane of the planar portion of the surface, whereby the resistivity of the n-type material at the apex is lower than that along the remaining portion of the rectifying junction. The depression is covered with a dielectric layer 16, advantageously a silicon dioxide film, over which is deposited a conductive layer which serves as the control electrode 17. Additionally, the electrode 18, which may be simply the metallic residue left on the surface in forming the alloy region 12A, makes low resistance ohmic connection to zone 12 and electrode 19 low resistance ohmic connection to zone 13.

For operation as a switch, electrode 19 is maintained at a positive potential with respect to the electrode 18 to bias the rectifying junction 11 in reverse to a value below that at which breakdown of the junction occurs. A switching signal is used to vary the potential on electrode 17 from a value insufficiently positive with respect to that of electrode 18 for breakdown to a value sufficiently positive for breakdown of the junction. The resistance of the wafer viewed between electrodes 18 and 19 is high before breakdown and low after breakdown whereby the device acts as a switch under the control of signals applied to the control electrode 17.

It is characteristic of the device just described that breakdown can be made to occur essentially only at the apex 15, thereby forming only a single localized breakdown region. This results because the electric field along the junction will be much higher at this limited portion than along the remainder of the junction and there will accordingly be a range of applied voltages for which the electric field is adequate for breakdown only along this limited portion.

The electric field in this region is a maximum since the resistivity of the n-type layer is at a minimum at the apex because of the graded resistivity characteristic of the n-type layer. As a result, a much narrower space charge layer occurs along this limited portion of the junction with a resulting higher electric field for a given voltage drop.

As a consequence of its localized nature, the properties of such a breakdown are reproducible to a high degree in contrast to the situation which occurs in the large area breakdown of a conventional planar junction.

Another factor important to the increased reproducibility of the breakdown conditions stems from the fact that the breakdown occurs internally in the wafer where the bulk properties are controlling, rather than at the surface where surface properties fix the characteristics. It is well recognized that the surface properties of a semiconductor are currently less well understood and less subject to control than its bulk properties. It is characteristic of avalanche breakdown along a planar rectifying junction which intersects the surface that such breakdown is strongly affected by surface conditions, making the starting conditions of the breakdown largely dependent on surface properties.

Figure 2A:
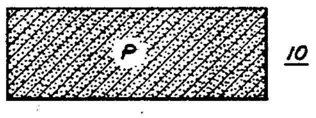
FIGS. 2A through 2E show the device of FIG. 1 in various stages of fabrication.

A switch of the kind described was fabricated as set forth below. Since the various fabrication steps are individually known to workers in the art, it is thought unnecessary to go into extensive detail. A monocrystalline silicon wafer about 125 mils square and ten mils thick with a specific resistivity of about 14 ohm-centimeters due to boron doping is first cut from a larger crystal of this resistivity. The large area surfaces were cut along the 100 planes for reasons to be discussed below. The wafer 10 is shown in FIG. 2A.

Figure 2B:
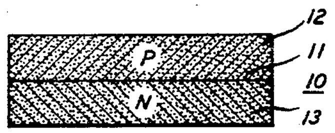

One of the large area surfaces of the wafer was then exposed to phosphorous pentoxide for diffusion therein of the phosphorus to a depth of about five mils for forming a p-n junction 11 between the p-type boron-rich original material 12 and the n-type phosphorous-diffused layer 13 as shown in FIG. 2B.

Figure 2C:
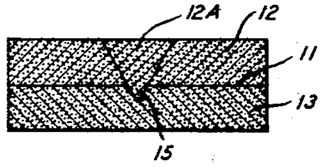

Aluminum was thereafter alloyed into the p-type face in the manner described in United States Patent 2,858,246 which issued to G. L. Pearson on October 28, 1958, to form an aluminum-alloy region in the form of a pyramid of square cross section whose sides are the four (111) planes. In particular, an aluminum wire was positioned to have one end in contact with the heated silicon wafer and as such end was melted more wire was supplied. This was continued long enough to result in penetration of the apex of the pyramid slightly past the original p-n junction, advantageously one mil, into the phosphorous-diffused region. In FIG. 2C there is shown the apex 15 of the aluminum-rich alloy region 12A penetrating beyond the original planar p-n junction.

Figure 2D:
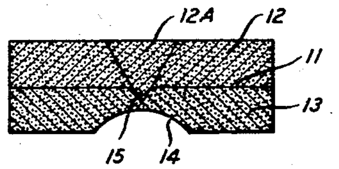

Thereafter, the rectifying junction was biased in reverse by the application of a suitable voltage to connections made to the wafer and while so biased an electrolytic jet was directed at the central portion of the phosphorous-diffused layer for etching away such layer in the presence of ultraviolet radiation. The etching solution included 8.4 grams of sodium fluoride and 5 cubic centimeters of concentrated hydrofluoric acid per liter of water. A stream of about 10 mils diameter and a current of two milliamperes through the electrolytic stream proved suitable. The voltage across the rectifying junction was monitored as the etching proceeded, and the etching was stopped when this voltage showed an abrupt change, indicating that penetration had been made to the space charge layer on the n-type side of the rectifying junction. The resultant is shown on a distorted scale in FIG. 2D, the depression 14 actually penetrating to about one micron from the apex of the aluminum-alloy region.

Thereafter, a silicon dioxide film was formed over the depression 14 by exposing the wafer to an oxidizing atmosphere. In particular, an oxide film of about 5,000 Angstroms was formed in conventional manner. The oxide film was removed over most of the surface of the wafer to leave only a film 16 over the depression 14.

Figure 2E:
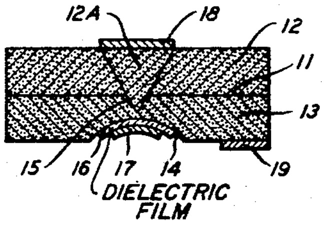

The control electrode 17 was thereafter formed by evaporating an aluminum dot over the central portion of the oxide film 16. Electrodes 18 and 19 were also applied in conventional manner. The resultant is shown in FIG. 2E.

It is, of course, to be understood that the invention is not dependent on any specific design or on any particular mode of fabrication. Various alternative designs and modes of fabrication will be evident to a worker in the art.

The particular device described when biased initially to a voltage of ten volts could be switched from a high to a low impedance state by the application of a ten volt signal to the control electrode. The leakage resistance across the oxide film, and so the input impedance, was in excess of ten megohms.

Figure 3:
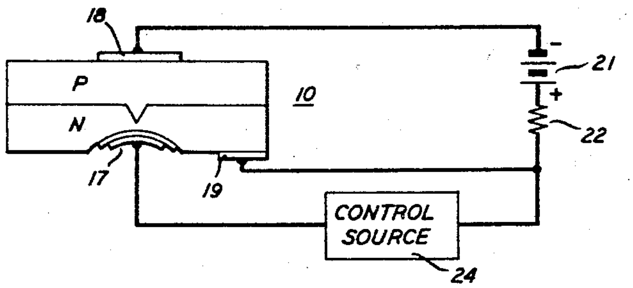
FIGS. 3 and 4 show typical circuits of the kind in which a semiconductive device in accordance with the invention can find application and FIG. 5 is a graph of the voltage-current characteristic of the device shown.

FIG. 3 shows a typical circuit arrangement utilizing a device of the kind described as a switch. The switch 10 is connected by way of its electrodes 18 and 19 in series with a source 21 of a D.-C. voltage and a load 22. The source biases the rectifying junction included in the switch in reverse short of breakdown whereby the switch introduces a high resistance in the series arrangement, and insignificant current flows in the load. The control electrode 17 is connected to a source 24 of a control signal, the signal being of magnitude and polarity that when applied to control electrode 17 breakdown of the rectifying junction in the switch occurs and the switch introduces only a low resistance in the series arrangement and appreciable current flows in the load. Upon cessation of the control signal breakdown stops, the switch returns to its high resistance state, and the current in the load is reduced to an insignificant value.

Figure 4:
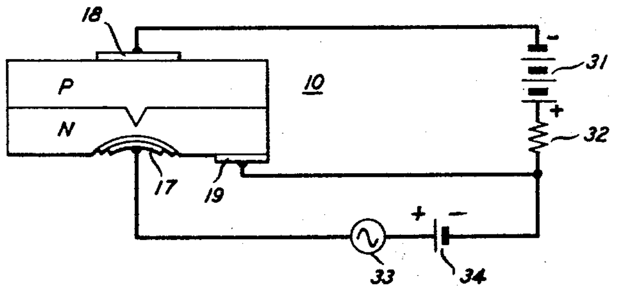

FIG. 4 shows a circuit arrangement utilizing a device of the kind described as an amplifier. The device is connected by way of its electrodes 18 and 19 in series with a source 31 of D.-C. voltage and a load 32. The source 31 biases the rectifying junction in the device in the breakdown region. There is connected between the control electrode 17 and the electrode 19 an input signal source 33 for varying the potential on the control electrode. The potential variations on the control electrode caused by the input signal will give rise to corresponding variations in the current flowing through the load, and large values of power amplification become feasible.

Figure 5:
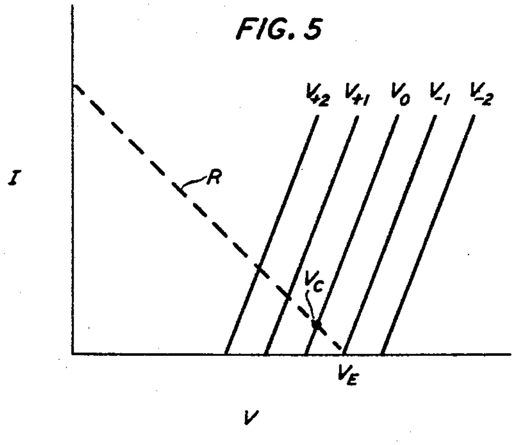

The operation of the amplifier described can better be appreciated by reference to the voltage-current characteristic for the device shown in FIG. 5 where the current available at electrodes 18 and 19 is plotted against the voltage between such electrodes for various values of voltage on the control electrode, the value of the subscript being a measure of the voltage difference between the control electrode 17 and the electrode 19.

The load line is plotted as the broken line R. For operation as an amplifier, the voltage source 31 is chosen to be $V_E$ resulting in operation about the point $V_c$. Because of the linear nature of the voltage-current characteristics about such point, linear amplification over a large range of signal values becomes feasible.

It can be appreciated that the invention is not limited to the specific geometry of the device shown in FIG. 1. It is important only to have a geometry such that upon application of a reverse bias the electric field along the rectifying junction reaches a peak at a limited area thereof which is removed from a region where the junction intersects the surface and to localize the control electrode close to such limited area of the junction.

Similarly, modifications in the materials used may be made in the specific embodiment described. For example, the wafer can instead be of any of the other semiconductive materials available, such as germanium, germanium-silicon alloys and group III–group V simiconductive compounds. Similarly, another form of insulating film may be substituted for the oxide film used to isolate the control electrode electrically from the semiconductive wafer.

Of course, too, the p-type and n-type regions in the wafer can be reversed so long as corresponding changes are made in the polarities of the voltages applied to the various electrodes.

For these reasons, it is to be understood that the specific embodiments described are merely illustrative of the general principles of the invention, and modifications may be devised without departing from the true spirit and scope of the invention.

What is claimed is:

1. A semiconductive device comprising a body of semiconductor material including a first and second region of opposite conductivity type defining a substantially planar junction, the said second region manifesting increasing resistivity in the direction approaching the said junction, and a third region of the same conductivity type as the said first region penetrating the said first region in a direction normal to said junction and partially penetrating said second region so as to distort said junction, so producing an interior junction region into and beyond said planar junction defined by the said third region, said interior junction region being of diminishing cross section in a plane normal to the direction of penetration in that direction such that the resistivity level of that portion of the said second region forming the said interior portion is lower than the portion of the said second region forming the remainder of the said junction, electrodes connected to opposite sides of the said body and a control electrode electrically insulated from the said body positioned at the surface portion of the said second region opposite the interior portion of the said junction.

2. The device of claim 1 in which the said control electrode is positioned at a depressed surface portion of the said second region.

3. The device of claim 1 in which the said body of semiconductor material is substantially monocrystalline silicon and the said control electrode is electrically insulated from the said body by an oxide film.

References Cited in the file of this patent

UNITED STATES PATENTS

| | | |
|---|---|---|
| 2,666,814 | Shockley | Jan. 19, 1954 |
| 2,791,758 | Looney | May 7, 1957 |
| 2,791,759 | Brown | May 7, 1957 |
| 2,791,760 | Ross | May 7, 1957 |
| 2,791,761 | Morton | May 7, 1957 |
| 2,792,539 | Lehovec | May 14, 1957 |